(12) United States Patent
Anthony

(10) Patent No.: US 6,358,757 B2
(45) Date of Patent: Mar. 19, 2002

(54) METHOD FOR FORMING MAGNETIC MEMORY WITH STRUCTURES THAT PREVENT DISRUPTIONS TO MAGNETIZATION IN SENSE LAYERS

(75) Inventor: Thomas C. Anthony, Sunnyvale, CA (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/824,810

(22) Filed: Apr. 3, 2001

Related U.S. Application Data

(62) Division of application No. 09/492,557, filed on Jan. 27, 2000.

(51) Int. Cl.⁷ .............................................. H01L 21/00
(52) U.S. Cl. ............................................................ 438/3
(58) Field of Search ..................... 438/3, 808; 365/158, 365/173, 171

(56) References Cited

U.S. PATENT DOCUMENTS

| 4,455,626 | A | * | 6/1984 | Lutes .......................... 365/158 |
| 5,748,524 | A | * | 5/1998 | Chen et al. .................. 365/173 |
| 5,861,328 | A | | 1/1999 | Tehrani et al. .............. 438/210 |
| 5,940,317 | A | * | 8/1999 | Durlam et al. .............. 365/171 |
| 5,956,267 | A | * | 9/1999 | Hurst et al. ................. 365/158 |

\* cited by examiner

Primary Examiner—Charles Bowers
Assistant Examiner—Craig Thompson

(57) ABSTRACT

A magnetic memory cell is disclosed having a structure that prevents disruptions to the magnetization in the sense layer of the magnetic memory cell. In one embodiment, the structure includes a high permeability magnetic film that serves as a keeper for the sense layer magnetization. The keeper structure provides a flux closure path that directs demagnetization fields away from the sense layer. In another embodiment, the structure contains a hard ferromagnetic film that applies a local magnetic field to the sense layer in the magnetic memory cell.

7 Claims, 5 Drawing Sheets

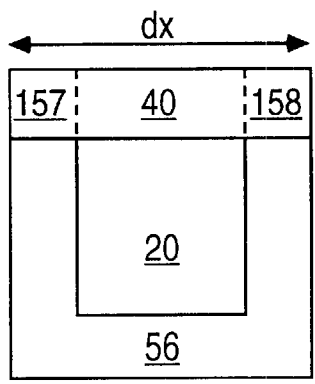
FIG. 1A
FIG. 1B
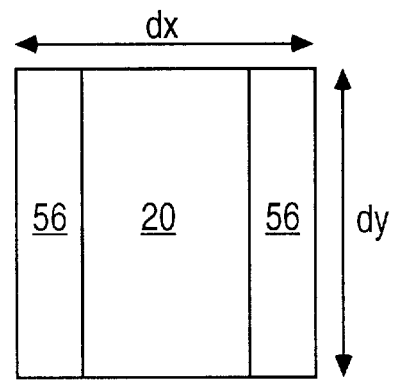
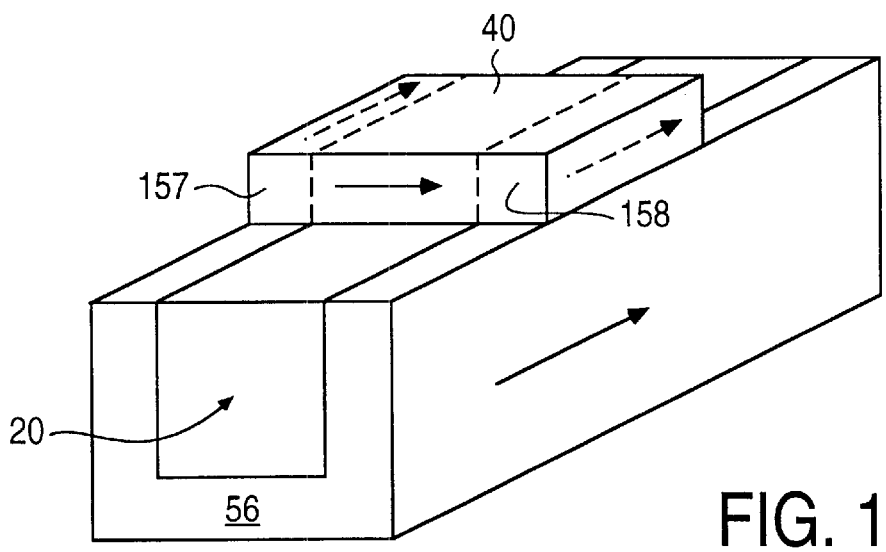
FIG. 1C

METHOD FOR FORMING MAGNETIC MEMORY WITH STRUCTURES THAT PREVENT DISRUPTIONS TO MAGNETIZATION IN SENSE LAYERS

This is a divisional of copending application Ser. No. 09/492,557 filed on Jan. 27, 2000.

BACKGROUND OF THE INVENTION

1. Field of Invention

The present invention pertains to the field of magnetic memories. More particularly, this invention relates to providing a magnetic memory with structures that prevent disruptions to magnetization in sense layers.

2. Art Background

A magnetic memory such as a magnetic random access memory (MRAM) typically includes an array of magnetic memory cells. Each magnetic memory cell usually includes a sense layer and a reference layer. The sense layer is usually a layer or film of magnetic material that stores magnetization patterns in orientations that may be altered by the application of external magnetic fields. The reference layer is usually a layer of magnetic material in which the magnetization is fixed or "pinned" in a particular direction.

The logic state of a magnetic memory cell typically depends on its resistance to electrical current flow. The resistance of a magnetic memory cell usually depends on the relative orientations of magnetization in its sense and reference layers. A magnetic memory cell is typically in a low resistance state if the overall orientation of magnetization in its sense layer is parallel to the orientation of magnetization in its reference layer. In contrast, a magnetic memory cell is typically in a high resistance state if the overall orientation of magnetization in its sense layer is antiparallel to the orientation of magnetization in its reference layer.

Typically, the overall magnetization pattern in the sense layer of a magnetic memory cell includes magnetization in its interior region and magnetization in its edge regions. In prior magnetic memory cells, demagnetization fields commonly present in the edge regions of the sense layer disrupt the overall orientation of magnetization in the sense layer from the desired parallel and antiparallel orientations. In addition, coupling fields and demagnetization fields from the reference layer can disrupt the magnetization of the sense layer from the desired parallel or antiparallel orientations. Such disruptions may manifest as undesirable magnetic domains.

Unfortunately, such disruptions to magnetization in the sense layer usually obscure the high and low resistance states of a magnetic memory cell, thereby making it difficult to determine the logic state of the magnetic memory cell during a read operation. In addition, the degree of disruption to sense layer magnetization may vary among the magnetic memory cells in an MRAM array and may vary between different MRAM arrays due to variation in the patterning steps and/or deposition steps of device manufacture. Such variation in the sense layer magnetization states usually leads to variations in the threshold switching field. Such variations in the threshold switching field typically produces uncertainty in MRAM write operations.

SUMMARY OF THE INVENTION

A magnetic memory cell is disclosed having a structure that prevents disruptions to the magnetization in the sense layer of the magnetic memory cell. In one embodiment, the structure includes a high permeability magnetic film that serves as a keeper for the sense layer magnetization. The keeper structure provides a flux closure path that directs demagnetization fields away from the sense layer. In another embodiment, the structure contains a hard ferromagnetic film that applies a local magnetic field to the sense layer in the magnetic memory cell.

The present techniques yield greater repeatability of magnetization characteristics among the magnetic memory cells in MRAM arrays. The structure has an additional advantage of enlarging the effective volume of the magnetic memory cell, thereby improving the thermal stability of the stored magnetization state. The structure also functions as an electromagnet to facilitate writing of the magnetic memory cells, thereby reducing MRAM power consumption.

Other features and advantages of the present invention will be apparent from the detailed description that follows.

BRIEF DESCRIPTION OF THE DRAWINGS

The present invention is described with respect to particular exemplary embodiments thereof and reference is accordingly made to the drawings in which:

FIGS. 1a–1c illustrate one embodiment of a structure for stabilizing a magnetic memory cell;

DETAILED DESCRIPTION

FIGS. 1a–1c illustrate one embodiment of a structure 56 for stabilizing a magnetic memory cell 40. The structure 56 encases a conductor 20 which provides a path for electrical current flow during read and write operations on the magnetic memory cell 40.

FIG. 1a shows a cross-sectional side view of the structure 56 and the magnetic memory cell 40 in a direction parallel to the length of the conductor 20. FIG. 1b shows a cut-away top view of the structure 56 and the conductor 20 through the magnetic memory cell 40. Portions of the structure 56 overlap a pair of edge regions 157–158 of the magnetic memory cell 40. FIG. 1c shows a perspective view of the structure 56 and the magnetic memory cell 40.

Figure 2:
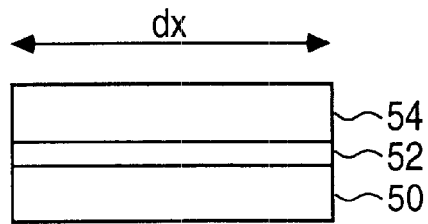
FIG. 2 shows one embodiment of the magnetic memory cell which is stabilized by a structure.

FIG. 2 shows one embodiment of the magnetic memory cell 40. The magnetic memory cell 40 includes a sense layer 50 that has an alterable magnetization state and a reference layer 54 having a pinned orientation of magnetization. In this embodiment, the magnetic memory cell 40 includes a tunnel barrier 52 between the sense layer 50 and the reference layer 54.

This embodiment of the magnetic memory cell 40 is a spin tunneling device in which an electrical charge migrates through the tunnel barrier 52 during read operations. This electrical charge migration through the tunnel barrier 52 occurs when a read voltage is applied to the magnetic memory cell 40. In an alternative embodiment, a giant magneto-resistive (GMR) structure may be used in the magnetic memory cell 40 in which the tunnel barrier 52 is replaced with a conductor such as Cu.

In one embodiment, the structure 56 serves as a keeper for the sense layer 50 magnetization and may be referred to as the keeper structure 56. The keeper structure 56 is a soft magnetic material that provides a mechanism for flux closure, thereby preventing the formation of demagnetization fields in the edge regions 157–158. The keeper structure 56 is a high permeability ferromagnetic film that is magnetized with an easy axis substantially perpendicular to the easy axis of the sense layer 50 of the magnetic memory cell 40. The proximity of the keeper structure 56 to the magnetic memory cell 40 causes any demagnetization fields that would have been produced in the absence of the keeper structure 56 to be directed through the keeper structure 56. This provides a path for flux that substantially eliminates demagnetizing fields from acting on the sense layer 50 in the magnetic memory cell 40. This prevents the overall magnetization in the sense layer 50 of the magnetic memory cell 40 from straying from the desired parallel or antiparallel directions with respect to the pinned reference layer 54 in the magnetic memory cell 40. The keeper structure 56 stabilizes the magnetic memory cell 40 in that it provides a pair of stable and discernable high and low resistance states for storing a data bit.

The keeper structure 56 reduces the electrical current level needed to write the magnetic memory cell 40 to a desired logic state. The keeper structure 56 is analogous to a single-turn electromagnet. Electrical current flowing through the conductor 20 rotates the magnetization of the keeper structure 56 from its quiescent state along its length to a direction perpendicular to the direction of electrical current flow according to the right hand rule. This creates a magnetic field along the easy axis of the sense layer 50 in the magnetic memory cell 40 which is useful for rotating the magnetization in the sense layer 50 to either the parallel or antiparallel state with respect to the pinned reference layer 54 of the magnetic memory cell 40.

A reduction in the electrical current level needed to write the magnetic memory cell 40 is desirable because it reduces power consumption in a magnetic memory such as an MRAM. A reduction in power consumption is particularly advantageous for portable applications. In addition, a reduction in the electrical current level needed to write the magnetic memory cell 40 reduces the integrated circuit chip area consumed by the power transistors that supply write currents. The chip area savings lowers the cost of a magnetic memory.

The keeper structure 56 obviates the need to reduce the thickness of the sense layer 50 in the magnetic memory cell 40 or to increase or elongate the $d_x$ and $d_y$ dimensions of the magnetic memory cell 40 in an attempt to reduce the effects of demagnetization fields in the sense layer 50. This enables magnetic memories to be formed with thicker sense layers which increases the thermal stability of the magnetic memory by increasing the magnetic volume of the magnetic memory cell 40 and enhances uniformity in the switching behavior among the magnetic memory cells of a magnetic memory. This also enables the formation of magnetic memory cells with smaller $d_x$ and $d_y$ dimensions which increases the data storage density of a magnetic memory. In addition, the keeper structure 56 itself adds effective magnetic volume to the magnetic cell 40 which increases the thermal stability of the stored magnetization state.

In one embodiment, the dimensions $d_x$ and $d_y$ of the magnetic memory cell 40 are selected to be substantially equal and form a square shape for its sense layer 50. The square shape of the sense layer 50 enhances the density that may be obtained in an MRAM in comparison to that which may be obtained when using rectangular memory cells. This is so because for a given minimum feature size more square magnetic memory cells may be formed on a given substrate area than rectangular magnetic memory cells. In other embodiments, rectangular or other shapes may be used.

The sense layer 50 or the reference layer 54 may be directly exchange coupled to the keeper structure 56 or magnetically decoupled from the keeper structure 56 by spacer layers.

In one embodiment, the magnetic memory cell 40 is positioned so that the sense layer 50 is adjacent to the keeper structure 56. The sense layer 50 is directly exchange coupled to the keeper structure 56 at the edge regions 157 and 158. The sense layer 50 is influenced by the magnitude and direction of the magnetic anisotropy of the keeper structure 56.

Figure 3A:
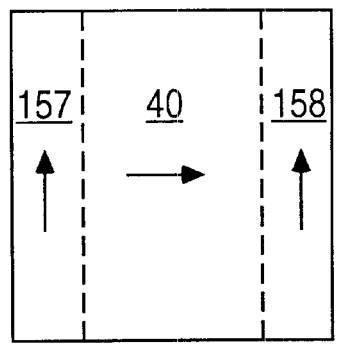
FIGS. 3a–3b show the "S" state and the "C" state, respectively, of the magnetization in a sense layer of a magnetic memory cell.
Figure 3B:
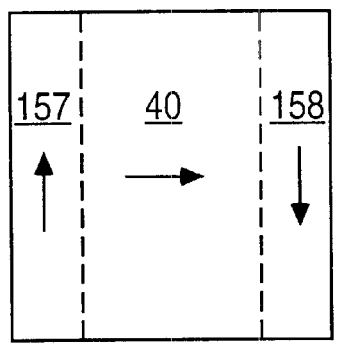

FIGS. 3a–3b show the "S" state and the "C" state, respectively, of the magnetization in the sense layer 50. Since the easy axis of the keeper structure 56 lies along the length of the conductor 20, the sense layer 50 has a local exchange field applied to the edge regions 157 and 158 that is perpendicular to the easy axis of the sense layer 50. Application of this orthogonal field in the edge regions 157 and 158 forces the sense layer 50 magnetization to be in a "S" state as opposed to an "C" state. The "S" state may have more reproducible switching characteristics.

Alternatively, the magnetic memory cell 40 is flipped over so that the reference layer 54 is adjacent to the keeper structure 56. The sense layer 50 is not exchange coupled to the keeper structure 56 but is influenced by the proximity of the permeable keeper structure 56 and no orthogonal field is generated in the edge regions 157–158.

Figure 4:
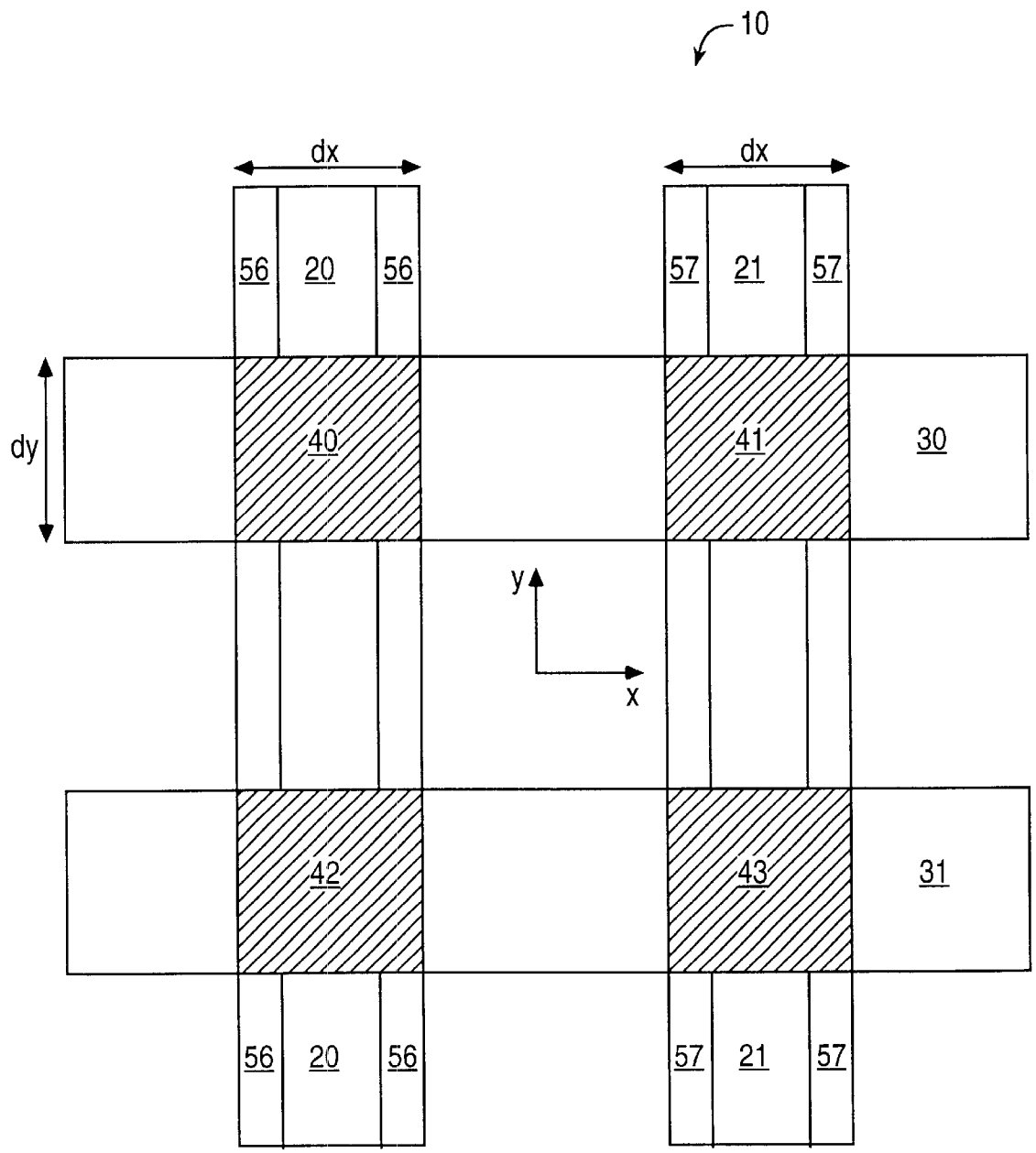
FIG. 4 is a top view of a magnetic memory, an MRAM, which incorporates the present teachings.

FIG. 4 is a top view of a magnetic memory 10, an MRAM, which incorporates the present teachings. The magnetic memory 10 includes an array of magnetic memory cells including the magnetic memory cell 40 along with additional magnetic memory cells 41–43. The magnetic memory 10 includes an arrangement of conductors 20–21 and 30–31 that enable read and write access to the magnetic memory cells 40–43.

The conductors 30–31 are top conductors and the conductors 20–21 are orthogonal bottom conductors encased in corresponding structures 56–57. The conductor 20 provides a bottom conductor for both magnetic memory cells 40 and 42 and the structure 56 provides a structure for both magnetic memory cells 40 and 42. Similarly, the conductor 21 provides a bottom conductor for both magnetic memory cells 41 and 43 and the structure 57 provides a structure for both magnetic memory cells 41 and 43.

The structures 56 and 57 are each magnetized with an easy axis that is substantially parallel to the y axis. The easy axes of the sense layers in the magnetic memory cells 40–43 are substantially parallel to the x axis. Electrical current flowing through the conductor 20 creates magnetic writing fields which are parallel to the x axis and parallel to the easy axes of the sense layers in the corresponding magnetic memory cells 40 and 42. Similarly, electrical current flowing through the conductor 21 creates magnetic writing fields parallel to the easy axes of the sense layers in the corresponding magnetic memory cells 41 and 43. Electrical current flow through the conductor 30 or 31 generates a magnetic field in the y direction. Only the magnetic memory cells that experience a combination of x and y magnetic fields are written.

FIGS. 5a–5e illustrate process steps for forming the structures 56–57 and the conductors 20–21 of the magnetic memory 10. The magnetic memory 10 is formed on a substrate 100 (FIG. 5a) which in one embodiment is a dielectric such as silicon-dioxide ($SiO_2$).

A set of trenches 102–104 (FIG. 5b) are formed in the substrate 100. The trenches 102–104 may be formed using, for example, reactive ion etching.

Next, a stabilization layer 106 (FIG. 5c) is deposited on the substrate 100 and its trenches 102–104. The stabilization layer 106 is a layer of ferromagnetic material which may be a soft magnetic material such as nickel-iron(NiFe) in a keeper structure embodiment or hard material such as CoPt, CoPtCr, or CoPtTa in the alternative embodiment. The stabilization layer 106 is preferably deposited using a technique such as sputtering which coats both horizontal and vertical surfaces of the substrate 100 and its trenches 102–104.

A layer of conductor material 108 (FIG. 5d) such as copper is then deposited on the stabilization layer 106. The conductor material 108 may be deposited using sputtering, evaporation, or plating steps.

Figure 5A:
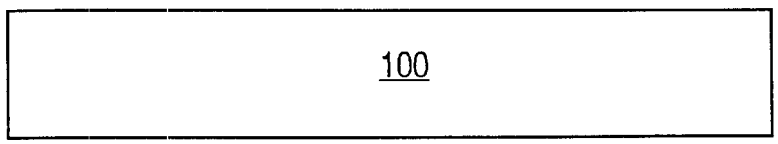
FIGS. 5a–5e illustrate process steps for forming the structures disclosed herein and the conductors of a magnetic memory.
Figure 5B:
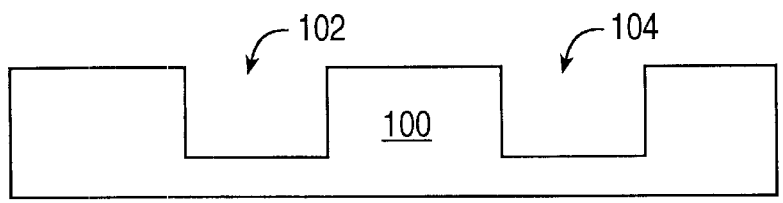
Figure 5C:
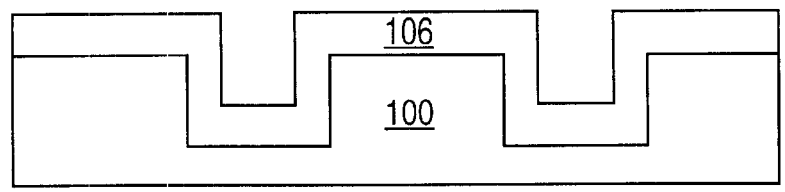
Figure 5D:
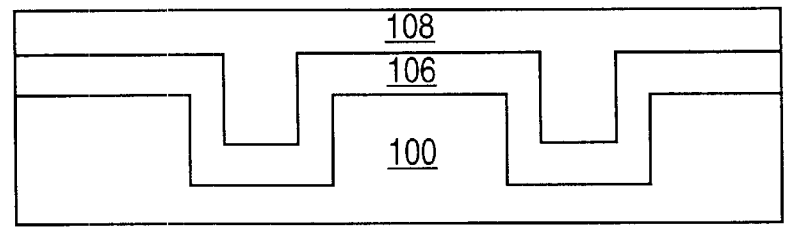
Figure 5E:
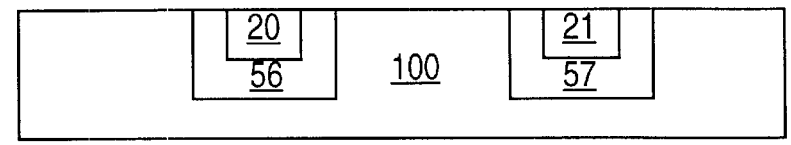

A chem-mechanical polishing (CMP) step is then applied to planarize the surface and expose the substrate 100 (FIG. 5e).

The layers of the magnetic memory cells 40–43 are then deposited on the polished surface of the substrate 100 and patterned over the structures 56–57. The layers for the magnetic memory cells 40–43 in one embodiment include the following. First, a set of seed layers of tantalum, nickel-iron, and iron-manganese are deposited. Next, a layer of nickel-iron is deposited which serves as the reference layers of the magnetic memory cells 40–43. A dielectric layer such as aluminum-oxide ($Al_2O_3$) is then deposited which serves as the tunnel barriers within the magnetic memory cells 40–43. Next, a layer of nickel-iron is deposited which is to be patterned into the sense layers of the magnetic memory cells 40–43. Finally, tantalum is deposited as an encapsulating layer.

In an alternative embodiment of a structure for stabilizing a magnetic memory cell 40, the structure 56 is a hard ferromagnetic material that is magnetized along the length of the conductor 20, a direction that is substantially perpendicular to the easy axis of the sense layer 50. In this alternative embodiment, the structure 56 does not function as a keeper but is instead a source of magnetic field for stabilizing the edge regions 157 and 158. The structure 56 is directly exchange coupled to the under side of the sense layer 50. As a result, the longitudinally magnetized hard magnetic material of the structure 56 interacts with the sense layer 50. Such an exchange coupled configuration generates the desired "S" state in the magnetization of the sense layer 50 by forcing the magnetization in the edge regions 157 and 158 to be aligned parallel to the direction of magnetization of the structure 56. Exchange coupling the sense layer 50 to the structure 56 forces the magnetization into the "S" state.

Figure 6:
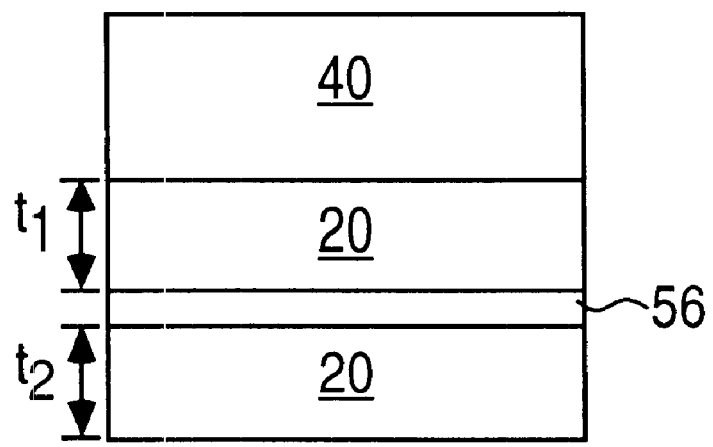
FIG. 6 shows another alternative embodiment of a structure for stabilizing a magnetic memory cell.

FIG. 6 shows another alternative embodiment of a structure for stabilizing a magnetic memory cell 40. In this alternative embodiment, the structure 56 is a soft magnetic film of uniform thickness which is patterned to substantially the same width as the conductor 20. The magnetization of the structure 56 lies parallel to the length of the conductor 20 and substantially perpendicular to the easy axis of the sense layer 50. The soft magnetic film that forms the structure 56 may be located anywhere through the thickness of the conductor 20. The total thickness of the conductor 20 is t which is equal to $t_1+t_2$ and the position of the structure 56 can range from $t_1=0$ to $t_2=0$.

Figure 7:
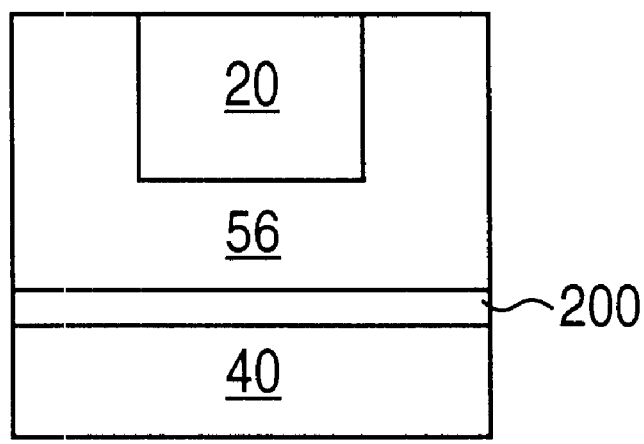
FIG. 7 shows yet another alternative embodiment of a structure for stabilizing a magnetic memory cell.

FIG. 7 shows another alternative embodiment of a structure for stabilizing the magnetic memory cell 40. In this alternative, the keeper structure 56 is inverted in comparison to the embodiment shown in FIGS. 1a–1c. A thin layer 200 of, for example, tantalum lies between the keeper structure 56 and the magnetic memory cell 40. The magnetization of the keeper structure 56 lies parallel to the length of the conductor 20 and substantially perpendicular to the easy axis of the sense layer 50.

The foregoing detailed description of the present invention is provided for the purposes of illustration and is not intended to be exhaustive or to limit the invention to the precise embodiment disclosed. Accordingly, the scope of the present invention is defined by the appended claims.

What is claimed is:

1. A method for forming a magnetic memory with a set of structures, comprising the steps of:

forming a set of trenches in a substrate;

depositing a layer of magnetic material for the structures so that the magnetic material coats horizontal and vertical surfaces of the trenches and the substrate;

depositing a layer of conductor material on the layer of magnetic material to fill the trenches;

polishing the layer of conductor material and the layer of magnetic material to expose an upper surface of the substrate.

2. The method of claim 1, wherein the conductor material is copper.

3. The method of claim 1, wherein the step of polishing comprises the step of polishing using a chem-mechanical process.

4. The method of claim 1, wherein the step of forming a set of trenches comprises the step of forming a set of trenches using reactive ion etching.

5. The method of claim 1, further comprising the steps of:

depositing a material for a sense layer in each of a set of magnetic memory cells in the magnetic memory;

depositing a material for a tunnel barrier in each of the magnetic memory cells;

depositing a material for a reference layer in each of the magnetic memory cells.

6. The method of claim 1, wherein the material for the sense layer is deposited before the materials for the tunnel barrier and reference layers.

7. The method of claim 6, wherein the material for the reference layer is deposited before the materials for the tunnel barrier and sense layers.

* * * * *